US 6,768,546 B2
Jul. 27, 2004

(12) United States Patent
Sato

(10) Patent No.: US 6,768,546 B2
(45) Date of Patent: Jul. 27, 2004

(54) PROJECTION EXPOSURE APPARATUS AND DEVICE MANUFACTURING METHOD USING THE SAME

(75) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/300,845

(22) Filed: Apr. 28, 1999

(65) Prior Publication Data

US 2003/0038937 A1 Feb. 27, 2003

(30) Foreign Application Priority Data

Apr. 30, 1998 (JP) .......................................... 10-136170

(51) Int. Cl.⁷ .............................................. G01B 11/00
(52) U.S. Cl. ...................................... 356/399; 355/53
(58) Field of Search .............................. 356/399, 400; 355/53, 55

(56) References Cited

U.S. PATENT DOCUMENTS

| 4,521,082 A | 6/1985 | Suzuki et al. .............. 350/405 |
| 5,262,822 A | 11/1993 | Kosugi et al. ................ 355/53 |
| 5,305,054 A | 4/1994 | Suzuki et al. ................ 355/53 |
| 5,459,547 A | 10/1995 | Shiozawa .................... 355/67 |
| 5,489,966 A | 2/1996 | Kawashima et al. .......... 355/43 |
| 5,499,100 A | 3/1996 | Tanaka ....................... 356/401 |
| 5,526,093 A | 6/1996 | Takahashi ................... 355/53 |
| 5,576,801 A | 11/1996 | Ushida et al. ............... 355/53 |
| 5,726,739 A | 3/1998 | Hayata ....................... 355/67 |
| 5,726,793 A | 3/1998 | Boardman et al. .......... 359/216 |
| 5,739,899 A | 4/1998 | Nishi et al. .................. 355/53 |
| 5,798,824 A | 8/1998 | Kudo .......................... 355/67 |
| 5,861,944 A | 1/1999 | Nishi .......................... 355/68 |
| 5,945,239 A * | 8/1999 | Taniguchi .................... 430/30 |
| 6,333,777 B1 | 12/2001 | Sato ............................ 355/53 |

FOREIGN PATENT DOCUMENTS

| JP | 1-42821 | 2/1989 |
| JP | 3-65623 | 3/1991 |
| JP | 6-244083 | 9/1991 |
| JP | 5-47626 | 2/1993 |
| JP | 5-47629 | 2/1993 |
| JP | 5-47640 | 2/1993 |
| JP | 5-343292 | 12/1993 |
| JP | 6-84759 | 3/1994 |
| JP | 6-204123 | 7/1994 |
| JP | 6-244083 | 9/1994 |
| JP | 7-29816 | 1/1995 |
| JP | 7-37798 | 2/1995 |
| JP | 7-183200 | 7/1995 |
| JP | 9-36026 | 2/1997 |
| JP | 9-126335 | 5/1997 |
| JP | 9-190969 | 7/1997 |
| JP | 9-254386 | 9/1997 |

\* cited by examiner

*Primary Examiner*—Frank G. Font
*Assistant Examiner*—Andrew H. Lee
(74) *Attorney, Agent, or Firm*—Fitzpatrick, Cella, Harper & Scinto

(57) ABSTRACT

A projection exposure apparatus includes an illumination optical system for illuminating a reticle having a pattern, with illumination light supplied from a light source, a projection optical system for projecting the pattern onto a substrate by use of the illumination light, a measuring system for measuring angular distribution of the illumination light, and an adjusting system for changing angular distribution of the illumination light, entering the projection optical system, on the basis of measurement by the measuring system and in accordance with a distance from an optical axis.

34 Claims, 11 Drawing Sheets

(A)

(B)

(C)

(D)

$I_0 * D_0 = I_1 * D_1$

PROJECTION EXPOSURE APPARATUS AND DEVICE MANUFACTURING METHOD USING THE SAME

FIELD OF THE INVENTION AND RELATED ART

This invention relates to a projection exposure apparatus and a device manufacturing method using the same.

In projection exposure apparatuses for use in the manufacture of semiconductor devices, for example, higher resolution has been required to meet enlargement of integration of VLSI. In this stream, ultra-resolution technology using an oblique incidence illumination method or a phase shift mask has been proposed. In such ultra-resolution technology, the aperture stop of an illumination optical system is modified to make smaller the σ value (the ratio between the NA (numerical aperture) of a projection optical system and the NA of the illumination optical system), or a secondary light source of a peculiar shape such as a ring zone shape or quadrupole shape, for example, is defined.

Also, in projection exposure apparatus for semiconductor device production, generally the optical arrangement is telecentric on the image side so that there occurs substantially no deviation of the position of a projected pattern image even if a substrate such as a wafer is at a defocused position.

In the stream of larger integration of recent VLSI, a very high transfer precision is required for printing of a circuit pattern. It is, therefore, very important to properly set the angular distribution of illumination light, entering a projection optical system. If illumination light with a predetermined angular relation with respect to the projection optical system is not supplied, then a positional deviation occurs in the position of a projected pattern image on an occasion when the wafer is at a defocused position.

When a wafer is defocused and a pattern is printed, a deviation in incidence angle of illumination light in magnification relation with the optical axis center, with respect to a projection optical system (i.e., deviation of incidence angle of each light ray with respect to the projection optical system, according to the distance (object height) to the optical axis), causes a positional deviation in magnification component corresponding to the image height, in the printed pattern. This deviation is referred to as magnification telecentricity or deviation of magnification telecentricity. FIG. 2 illustrates this, wherein broken lines denote an optical axis or a line parallel to it.

In FIG. 2, denoted at 16 is a projection optical system, and denoted at 18 is a substrate (wafer). Denoted at La is the optical axis of the projection optical system 16. A shift or deviation of incidence angle of illumination light with respect to the projection optical system, with which chief rays are inclined in the same direction regardless of object height, causes a shift or deviation of a printed pattern when the wafer 18 is defocused (this deviation is referred to as an on-axis telecentricity or deviation of on-axis telecentricity). FIG. 3 illustrates this, wherein broken lines denote an optical axis or a line parallel to it.

This means that images are printed with deviation when, during the procedure of plural lithographic processes, circuit patterns are to be superposedly printed on a wafer having surface steps formed thereon. It is very undesirable for production of high precision semiconductor devices.

In many projection exposure apparatuses, positions of components of an illumination system are adjusted so that it provides illumination light with an angular characteristic best for a certain standard illumination mode A. However, when the illumination mode A is changed to a different illumination mode B (such as for oblique incidence illumination or smaller σ value), the components of the illumination system, if they are unchanged as in the illumination mode A, do not always provide illumination light with a proper angle. This is because the optical path is different between these illumination modes and also the effect of eccentricity of a lens system or non-uniformness of an anti-reflection film of an optical element differs.

In projection exposure apparatuses, the effect of an anti-reflection film used for an optical element differs with the angle of a light ray. Thus, when the illumination mode is changed, there may occur a deviation of magnification telecentricity. Similarly, when the illumination mode is changed, the effect of reflection non-uniformness at deflection by a mirror or the effect of eccentricity of an optical system changes. Thus, there may occur a deviation of on-axis telecentricity.

If such magnification telecentricity or on-axis telecentricity is corrected by moving the optical system, it causes a change in illuminance distribution on the surface to be illuminated (such as a reticle surface or wafer surface), thus enlarging illuminance non-uniformness. It is not easy to correct both of them in conventional exposure apparatuses.

SUMMARY OF THE INVENTION

It is an object of the present invention to provide a projection exposure apparatus by which, based on correction of magnification telecentricity deviation, illumination light can be supplied with an optimum angle such that a pattern image can be formed with a very high resolution.

It is another object of the present invention to provide a device manufacturing method using such a projection exposure apparatus.

In accordance with an aspect of the present invention, there is provided a projection exposure apparatus having an illumination optical system for illuminating a reticle having a pattern, a projection optical system for projecting the pattern onto a substrate, and measuring means for measuring an angular distribution of illumination light, wherein an optical element in a portion of said illumination optical system is displaced along an optical axis direction on the basis of a measurement result of said measuring means, to change the angular distribution of the illumination light entering the projection optical system, with magnification with respect to the optical axis center.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
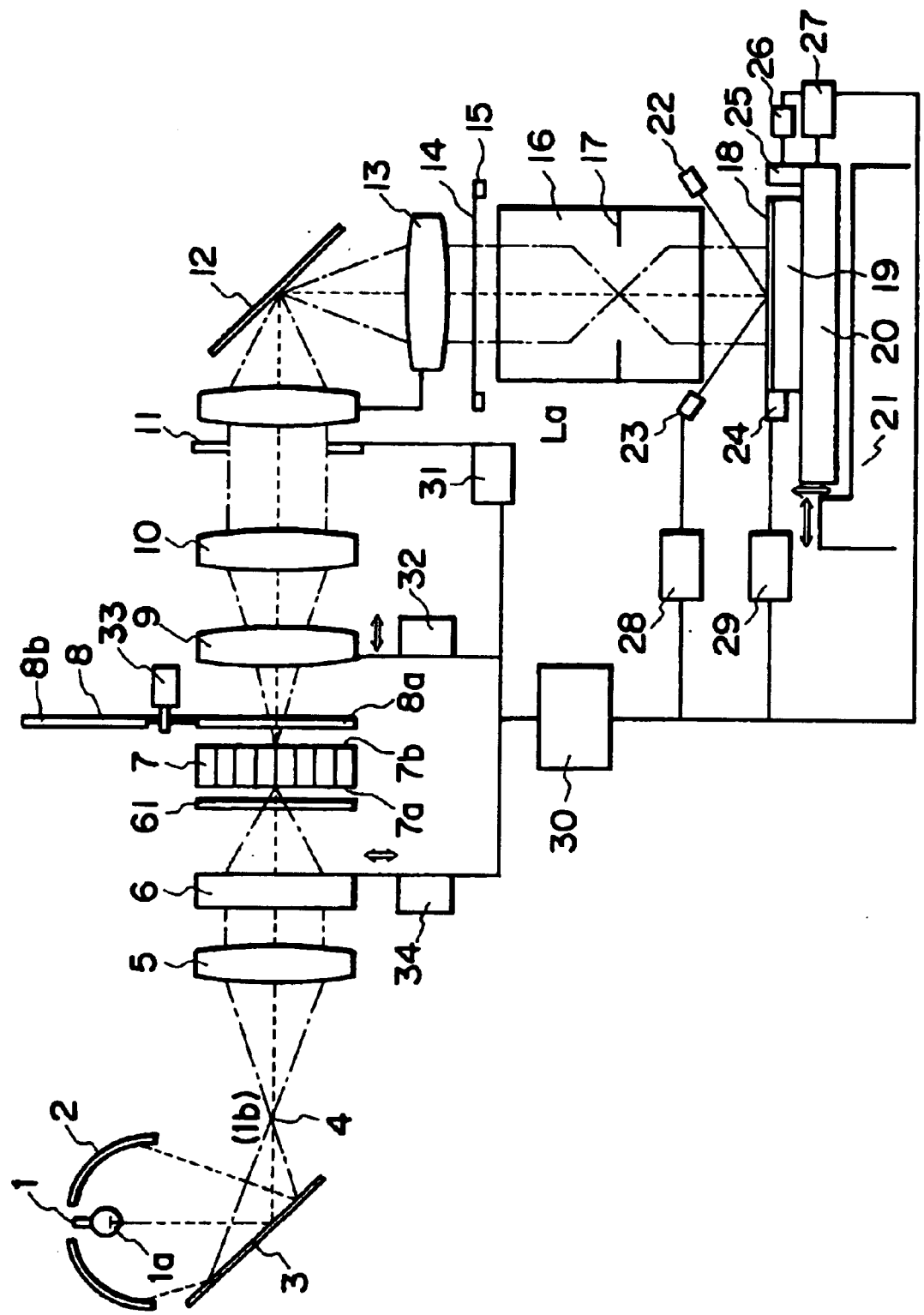
FIG. 1 is a schematic view of a projection exposure apparatus according to an embodiment of the present invention.
Figure 2:
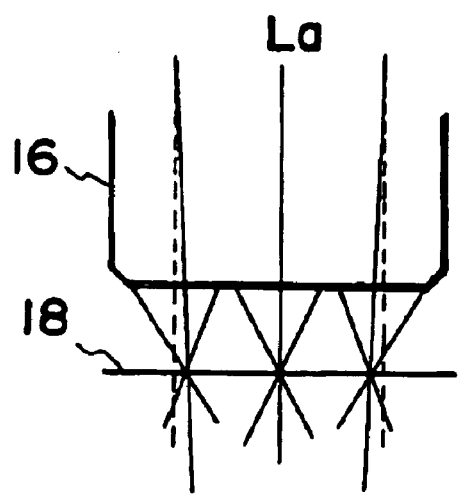
FIG. 2 is a schematic view for explaining deviation of magnification telecentricity.
Figure 3:
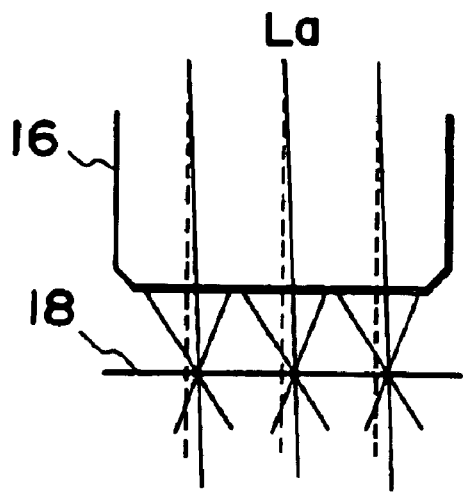
FIG. 3 is a schematic view for explaining deviation of on-axis telecentricity.

FIG. 1 is a schematic view of a first embodiment of the present invention. In this embodiment, the invention is applied to a projection exposure apparatus of a step-and-repeat type or step and-scan type for a lithographic process of submicron order or quartermicron order.

Denoted in the drawing at 1 is a light emitting tube of a light source, such as an Hg lamp, for example. It has a high-luminance light emitting portion 1a which emits ultraviolet rays or deep ultraviolet rays. The light emitting portion 1a is disposed at or adjacent a first focal point of an elliptical mirror 2.

Denoted at 3 is a cold mirror having a multilayered film, which serves to transmit most of infrared light but to reflect most of ultraviolet light. In association with this cold mirror 3, the elliptical mirror 2 functions to form an image (light source image) 1b of the light emitting portion 1a, at or adjacent its second focal point 4.

Denoted at 5 is an optical system which comprises a condenser lens, a collimator lens and/or a zoom lens, for example. It serves in association with an optical system 6 to image the light source image 1b, formed at or adjacent the second focal point 4 of the elliptical mirror 2, upon a light entrance surface 7a of an optical integrator 7. The optical system 6 is made tiltable and movable in a direction orthogonal to the optical axis, or mountable/demountable, by means of an optical system driving mechanism 34.

The optical integrator 7 comprises a plurality of small lenses having a rectangular shape in section and being disposed in a two-dimensional array at a predetermined pitch. It serves to produce secondary light sources adjacent its light exit surface 7b. Adjacent this light exit surface 7b of the optical integrator 7, there is a stop mechanism 8 having plural stop members 8a and 8b. Stop driving mechanism 33 serves to change the stop in the stop mechanism, to be placed on the optical path, by which the size and shape of the secondary light sources can be changed.

In this embodiment, stop members having different aperture shapes are selectively used in accordance with the shape of a pattern of a reticle 14 used, whereby the light intensity distribution to be produced at a pupil plane 17 of a projection optical system 16 is selectively changed. Details are discussed in Japanese Laid-Open Patent Application, Laid-Open No. 47626/1993 or No. 47640/1993.

Denoted at 9 is a lens element (optical element) which can be moved along the optical axis direction by a driving mechanism 32 so as to change the angular distribution of illumination light (angular light quantity distribution of illumination light, illuminating a certain point on the reticle 14 surface), with magnification with respect to the optical axis center (i.e., in accordance with the distance of the certain point on the reticle 14 surface to the optical axis of the projection optical system 16).

Denoted at 10 is a condenser lens which serves to superposedly and uniformly illuminate the surface of a masking blade 11 with light beams emitted from the secondary light sources adjacent the light exit surface 7b of the optical integrator 7. The masking blade 11 comprises a plurality of movable light blocking plates which can be moved by a masking blade driving mechanism 31 to variably define a desired aperture shape, by which the illumination range on the reticle 14 surface is adjusted.

Denoted at 13 is an imaging lens which cooperates with a mirror 12 to project the aperture shape of the masking blade 11 upon the reticle 14 surface, whereby a predetermined region on the reticle 14 surface can be illuminated uniformly. The reticle 14 is held by a reticle stage 15.

The projection optical system (projection lens) 16 serves to project a pattern on the reticle 14 surface onto a wafer (substrate) in reduced scale. Denoted at 17 is a pupil of the projection optical system, and denoted at 18 is a wafer (substrate) onto which the circuit pattern of the reticle 14 is projected and transferred. Denoted at 19 is a wafer chuck for holding the wafer 18 and being movable along the optical axis direction. Denoted at 20 is an X-Y stage for holding the wafer chuck 19 and being movable two-dimensionally along a plane orthogonal to the optical axis. Denoted at 21 is a base table on which the projection lens 16 and the X-Y stage are mounted.

For the operation to be described later, the X-Y stage 20 is arranged to be movable upwardly and downwardly along the optical axis direction, by an amount not less than a predetermined amount.

In the optical arrangement of this embodiment, the light emitting portion 1a, the second focal point 4, the light entrance surface 7a of the optical integrator 7, the masking blade 11, the reticle 14 and the wafer 18 surface are placed in an optically conjugate relation with each other. Also, the stop of the stop mechanism 8 and the pupil plane 17 of the projection optical system 16 are placed approximately in a conjugate relation with each other.

Denoted at 22 and 23 are components of a surface position detecting system for detecting the position (level) of the surface of the wafer 18 with respect to the optical axis direction. Here, denoted at 22 is an illumination system for illuminating the wafer 1B, and denoted at 23 is a light receiving system for receiving reflection light from the wafer 18 surface and for producing a signal corresponding to the position of the wafer 18. Denoted at 28 is a control device for controlling the illumination system 22 and the light receiving system 23.

Denoted at 25 is a reflection mirror fixedly mounted on the X-Y stage 20, and denoted at 26 is a laser interferometer for projecting laser light to the reflection surface of the mirror 25 and for detecting the amount of displacement of the X-Y stage 20. Denoted at 27 is a driving system for controlling movement of the X-Y stage on the basis of an output from the laser interferometer 26.

The driving system 27 receives surface position information about the surface level of the wafer 18, via the control device 28, and operates to move the wafer chuck 19 in the optical axis direction so that the wafer 18 surface is registered with the imaging plane of the projection lens system 16 where the device pattern of the reticle 14 is imaged.

Denoted at 24 is a detector (such as an illuminomitor or a sensor) which is one of the components of measuring means for detecting angular distribution and illuminance distribution of illumination light on the wafer 18 surface. It serves to receive illumination light while moving in the illumination field region with the motion of the X-Y stage 20, and to supply a signal corresponding to its output to a detecting system 29.

Denoted at 30 is a main control for controlling various elements 27, 28, 29, 31, 32, 33 and 34. Information from the detecting system 29 is supplied to this main control 30. In this embodiment, the members disposed from the light source 1 to the reticle 14 serve as components which provide an illumination optical system.

The projection optical system of this embodiment has a function for correcting changes, as below, independently from each other which might be produced when the illumination condition is changed:

a) Deviation of magnification telecentricity attributable to illumination light entering the projection optical system;

b) Deviation of on-axis telecentricity attributable to illumination light entering the projection optical system; and c) Change in illuminance distribution upon a surface to be illuminated.

In the projection exposure apparatus of this embodiment, the lens element 19 disposed between the optical integrator 7 and the masking means 11 for regulating the illumination region can be moved, such that, substantially without changing any other performance of the illumination optical system, the angular distribution of illumination light which illuminates a certain point on the reticle 14 surface and enters the projection optical system can be changed with magnification with respect to the optical axis center (i.e., in accordance with the distance (object height) of the certain point on the reticle 14 surface to the optical axis), whereby correction of magnification telecentricity is performed.

Also, as regards the deviation of on-axis telecentricity, the optical system 6 disposed at the light source 1 side of the optical integrator 7 can be adjusted or inserted/demounted, by which the incidence angle of light entering the optical integrator 7 can be made variable. Thus, by tilting illumination light rays entering the projection optical system in the same direction, the on-axis telecentricity deviation can be corrected.

In this embodiment, the angular distribution of rays of illumination light from various points on the reticle 14 surface is measured by the measuring means 24. On the basis of the result of measurement, any deviation of magnification telecentricity or on axis telecentricity is corrected. Additionally, any illuminance non-uniformness caused in response to displacement of the optical element for correction of the magnification telecentricity and/or on-axis telecentricity, is corrected by means of a correcting mechanism separate from the correcting means for the magnification telecentricity and on-axis telecentricity.

Now, measurement of angular distribution of illumination light, illuminating a certain point on the reticle 14 surface and emitting from the projection optical system 16, by use of measuring means will be explained. The angular distribution of illumination light, illuminating a certain point on the reticle 14 surface and entering the projection optical system 16, can be detected from the angular distribution of illumination light emitting from the projection optical system 16 and the magnification of the projection optical system 16, for example.

Figure 4:
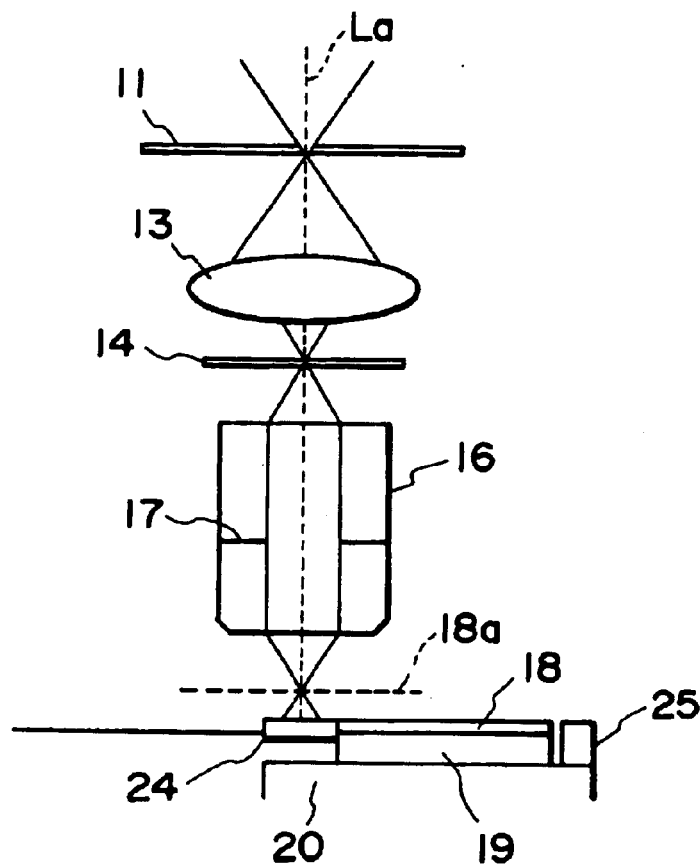
FIG. 4 is a schematic view for explaining measurement of angular distribution of illumination light, in an embodiment of the present invention.

A first example of measuring the angular distribution of illumination light will now be described. When, for example, the angular distribution of illumination light at the center of a picture field (i.e., optical axis La position) is to be measured, the opening defined by the masking blade 11 is restricted by the masking blade actuating means 31 so that small illumination light passes only the optical axis La position. Here, as shown in FIG. 4, the detector 24 is moved to the position substantially on the optical axis La and, also, it is placed below the wafer surface position 18a (to be assumed by the wafer practically) along the optical axis La direction by a predetermined distance. Only the illumination light as restricted by the masking blade 11 is imaged once upon the wafer surface position 18a and, then, the light impinges on the detector 24 while reflecting or maintaining the irradiation angle. The light intensity is measured by the detector 24 while moving the X-Y stage two-dimensionally. The results of measurement are then plotted two-dimensionally, whereby measurement of the angular distribution of illumination light is accomplished.

In a case where the angular distribution of illumination light at any point on the wafer surface position 18a other than the optical axis position is to be measured, a small opening may be defined by using the masking blade 11 at a position on the masking blade plane corresponding to the point to be measured. Also, the X-Y stage 20 may be moved two-dimensionally so that the detector 24 position is placed at the measurement position and below the wafer surface position by a predetermined distance. Then, the measurement may be performed.

Any other method may be used, for example, a method using a CCD (image pickup device) for the detector 24, or a method in which the angular distribution of illumination light is discriminated by using a combination of a CCD and a light blocking plate having a pinhole, to be placed on the wafer surface. A method as disclosed in Japanese Patent Application No. 254386/1997 may be used.

A second example for measuring the angular distribution of illumination light will now be described.

Figure 5:
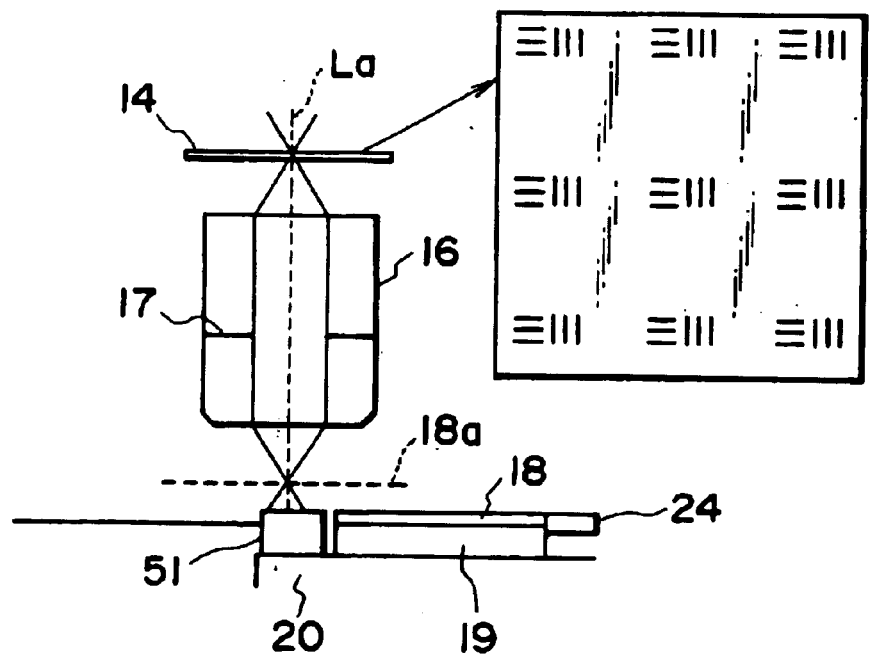
FIG. 5 is a schematic view for explaining measurement of an angular distribution of illumination light, in another embodiment of the present invention.

In this example, as shown in FIG. 5, the reticle 14 is provided with a reticle pattern (mark) of small openings. Denoted at 51 is a detector which is disposed adjacent the wafer 18 surface and detects the position of an image of the reticle pattern, on the basis of the quantity of light incident thereon. More specifically, the detector 51 serves to detect the quantity of light passing through the reticle pattern (mark) of small openings, formed on the reticle 14, and then impinging on the wafer 18, by which the position of the pattern image is measured.

While defocusing the detector 51 in the optical axis La direction together with the X-Y stage 20, the position of the image is detected sequentially. From the shift of the image position with the defocusing, any deviation of telecentricity of the projection optical system 16 is detected.

Now, a third example of measuring the angular distribution of illumination light will be described.

A reticle pattern is printed by projection exposure on a wafer having a photosensitive material such as a resist applied thereto. In this operation, exposures of shots are performed while changing the focus sequentially by a predetermined amount. Then, a development process is performed to the exposed wafer and, subsequently, by using an SEM (scanning electron microscope), for example, positions of images of the pattern printed with different focus states are observed and compared with each other. From the amount of shift between these images in different focus states, any deviation of telecentricity of the projection optical system 16 is detected.

The measurement may be performed such as described above, and deviation may occur in the projection optical system 16 in respect to magnification and on-axis telecentricity. Particularly, in many projection exposure apparatuses, positions of components of an illumination system are adjusted so that it provides illumination light with an angular characteristic best for a certain standard illumination mode A. However, when different illumination modes are used, since the optical paths in these modes are different, the angular characteristic or non-uniformness of an anti-reflection film of an optical element or the effect of eccentricity of the lens system differs. Therefore, when the illumination mode A is changed to a different illumination mode B (such as for oblique incidence illumination or smaller σ value), the components of the illumination system, if they are unchanged as in the illumination mode A, do not always provide illumination light with a proper angle.

Figure 6:
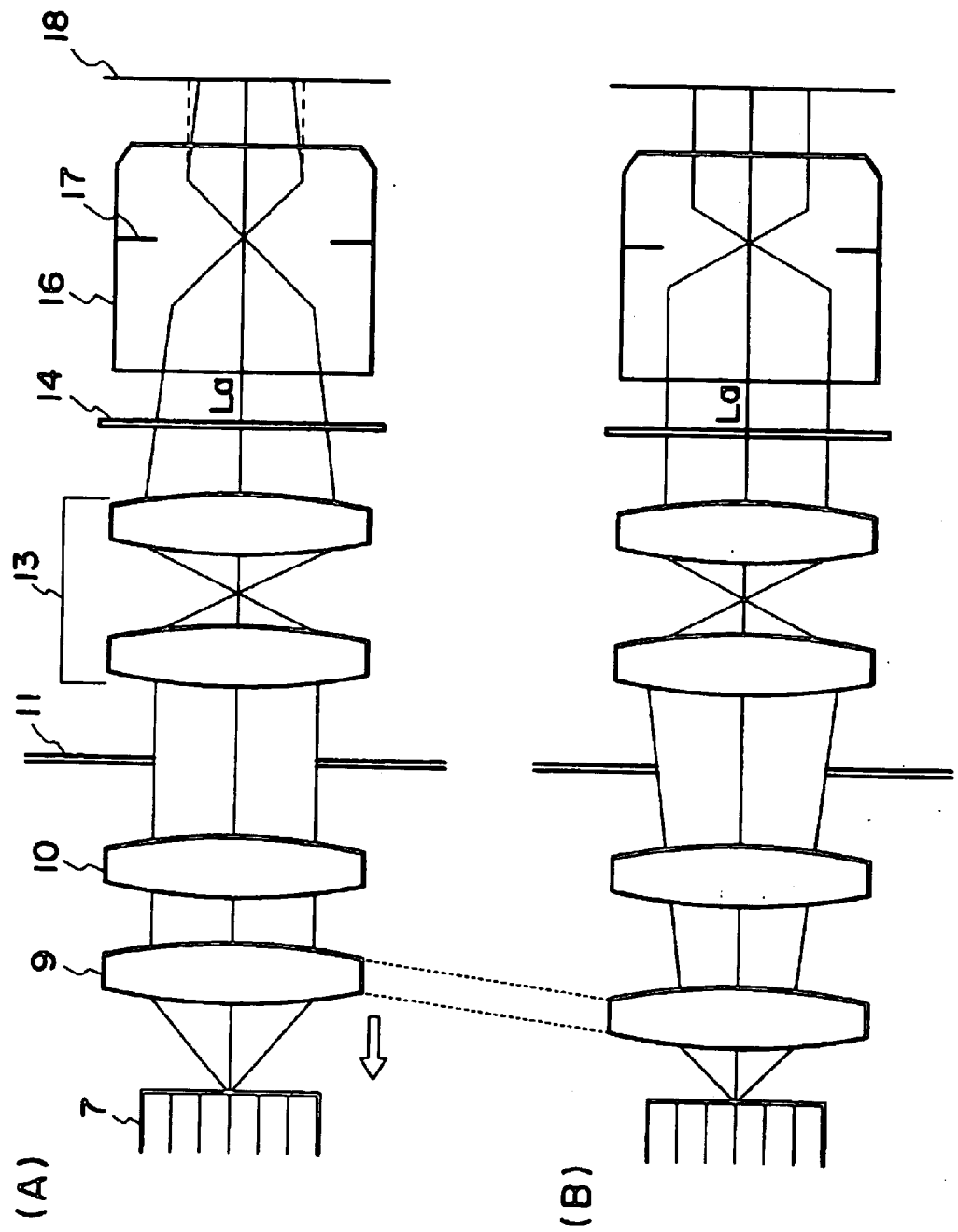
FIG. 6 is a schematic view for explaining a magnification telecentricity correcting mechanism.

Referring now to FIG. 6, an example of correction of deviation in magnification telecentricity will be described.

There is a mechanism for moving a lens element 9 in the optical axis direction, by which magnification telecentricity (i.e., incidence angles of chief rays corresponding to image heights, with respect to the image plane) changes substantially linearly. The structure is so arranged that, while the magnification telecentricity changes with the driving mechanism, the remaining performance (e.g., illumination NA or uniformness of effective light source) is substantially unchanged. Thus, the lens element 9 is moved to correct deviation of magnification telecentricity, independently of the other performance. FIG. 6, in part (A), illustrates a change in magnification telecentricity with motion of the lens element 9, and, in part (B), it illustrates variation of magnification telecentricity.

Figure 7:
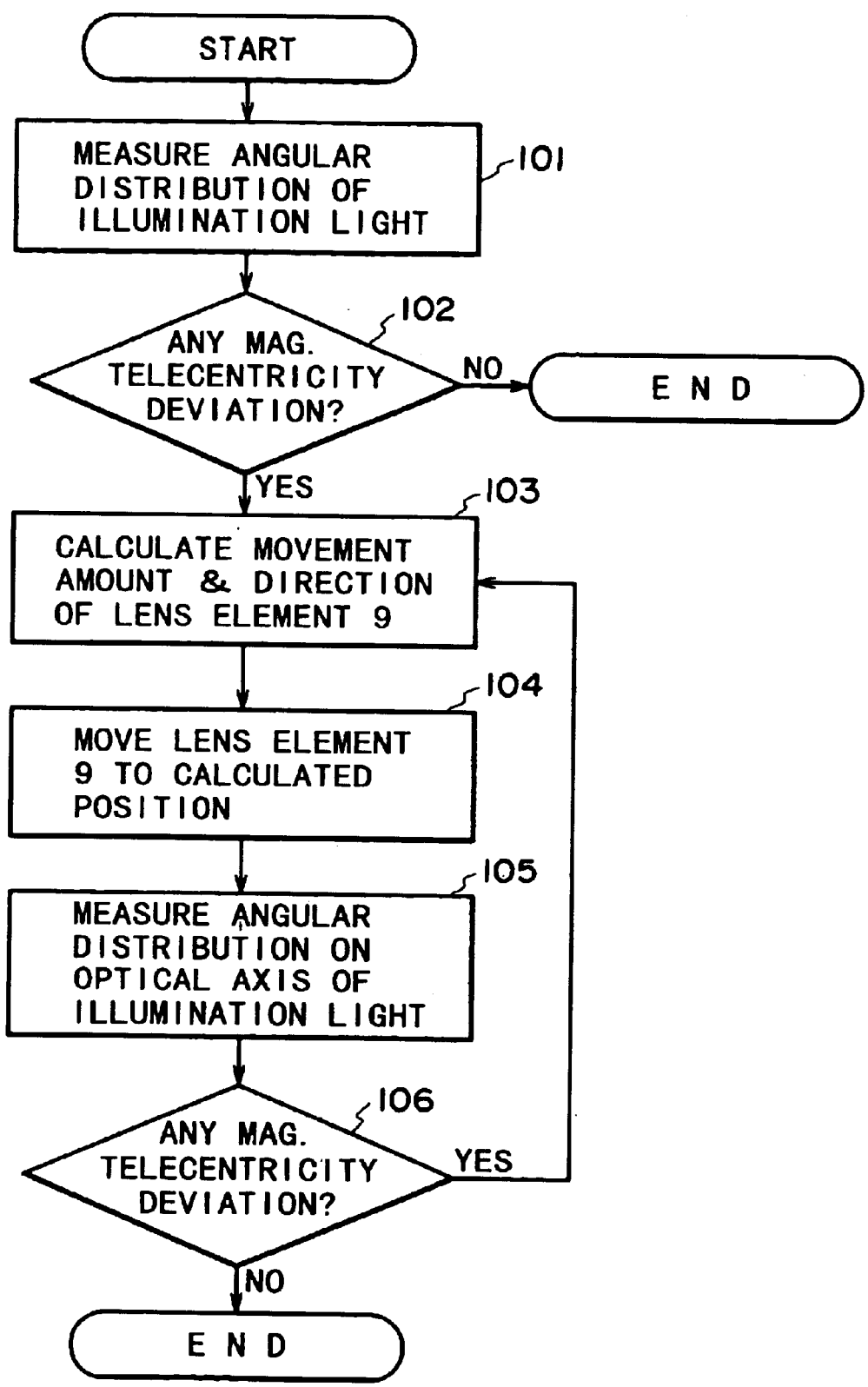
FIG. 7 is a flow chart for explaining the procedure of correction of magnification telecentricity, in an embodiment of the present invention.

FIG. 7 is a flow chart for explaining the procedure for correcting deviation of magnification telecentricity in this embodiment.

First, by using the mechanism described hereinbefore, the angular distribution of illumination light entering the projection optical system 16 is measured (step 101). On the basis of the amount of deviation of magnification telecentricity as detected by the detecting system 29, the control device 30 discriminates the necessity of correction (step 102) and, if it is necessary, calculates the direction and amount of movement of the lens element 9 to be made (step 103). Then, it applies a signal, corresponding to the movement direction and movement amount, to the lens system driving mechanism 32. On the basis of this signal, the lens system driving mechanism 32 moves the lens element 9 along the optical axis, in a corresponding direction and by a corresponding amount (step 104). After this driving, angular distribution of illumination light is measured again (step 105). If deviation of magnification telecentricity is within a tolerable range (106), the procedure goes to the next step. If not so, the operation described above is repeated, until the deviation comes into the tolerable range.

Figure 8:
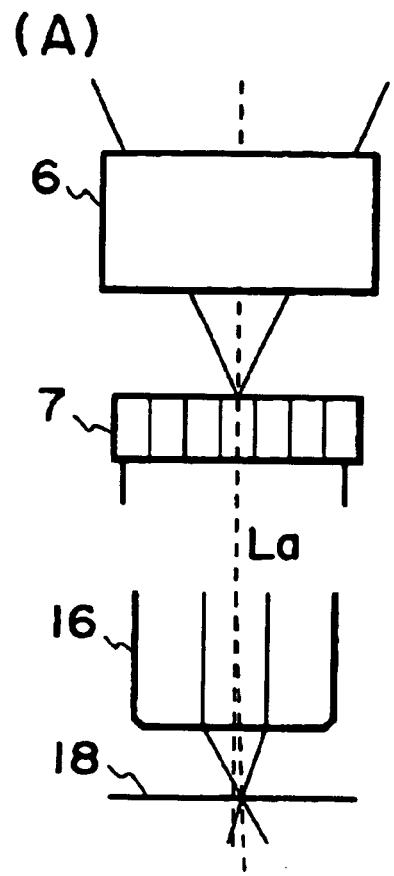
FIG. 8 is a schematic view for explaining an on-axis telecentricity correcting mechanism, in an embodiment of the present invention.
Figure 8:
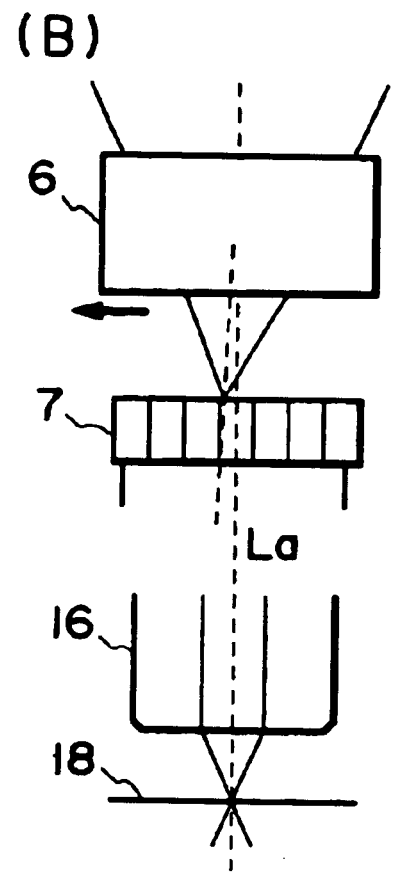
Figure 8:
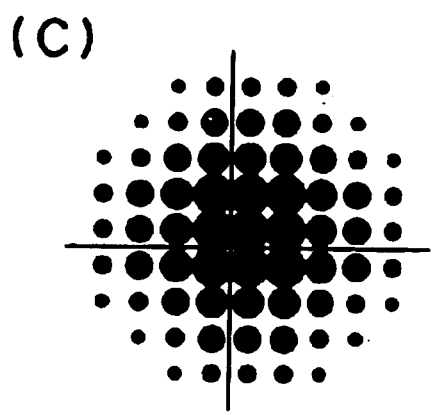
Figure 8:
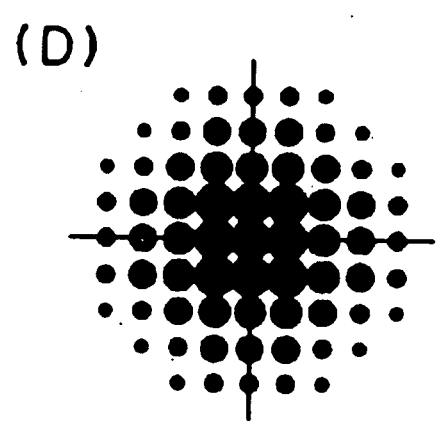

Referring now to FIG. 8, correction of deviation of on-axis telecentricity will be described.

If there is deviation of on-axis telecentricity such as illustrated in FIG. 8 in part (A), in order to correct the direction of incidence light, since the wafer 18 surface and the light entrance surface 7a of the optical integrator are optically conjugate with each other, the direction of light entering the optical integrator may be changed.

In this embodiment, this is accomplished by tilting or moving the optical system 6 (as changing means) in a direction orthogonal to the optical axis, or by inserting/demounting it (part (B) in FIG. 8).

Figure 9:
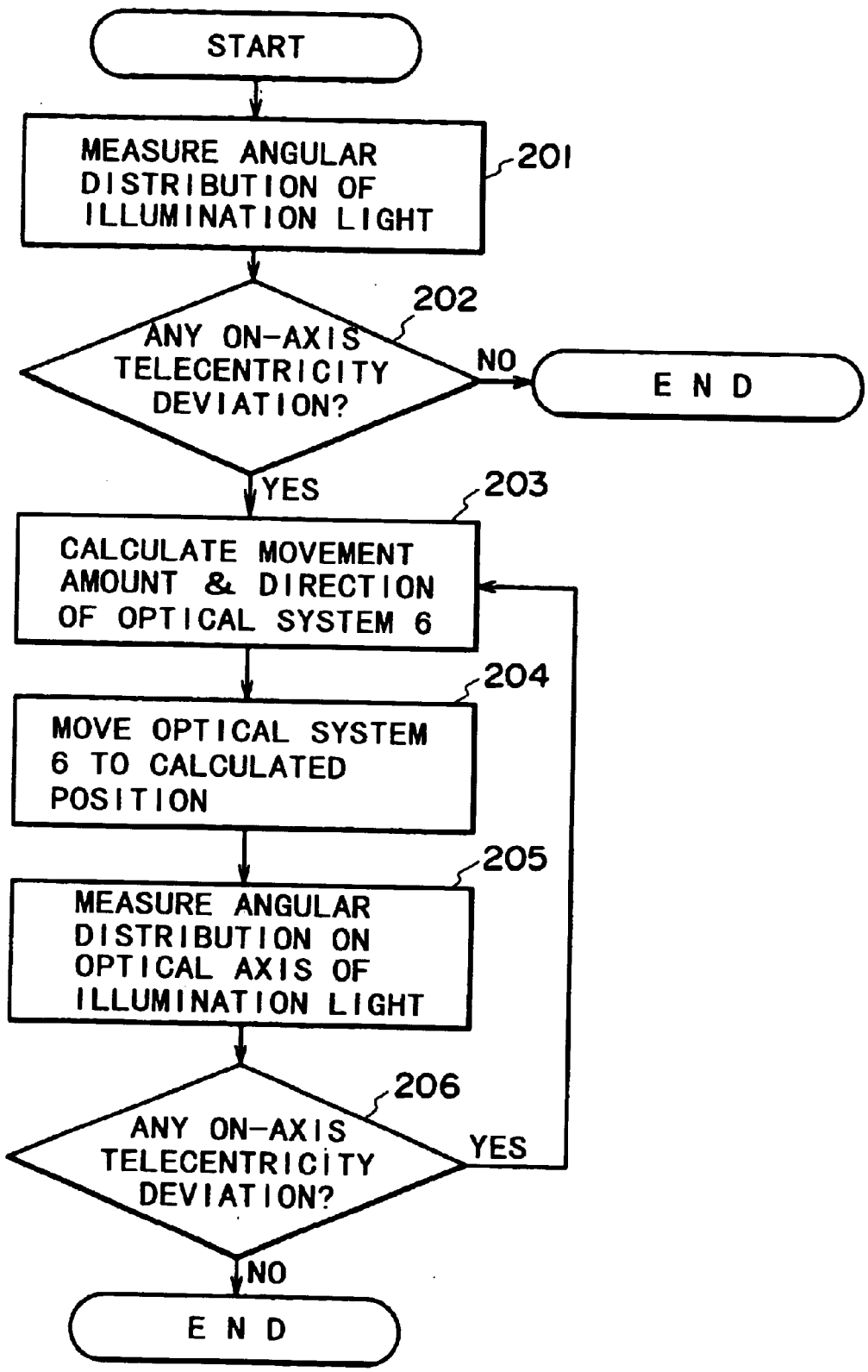
FIG. 9 is a flow chart for explaining the procedure of correction of on-axis telecentricity, in an embodiment of the present invention.

FIG. 9 is a flow chart for explaining the procedure of correcting deviation of on-axis telecentricity, in this embodiment. An example disclosed in Japanese Patent Application No. 254386/1997 may be used.

In the flow chart of FIG. 9, first, the angular distribution of illumination light entering the projection optical system 16 is measured (step 201). On the basis of the amount of deviation of on-axis telecentricity as detected by the detecting system 29, the control device 30 discriminates the necessity of correction (step 202) and, if it is necessary, calculates the direction and amount of movement of the optical system 6 to be made (step 203). Then, it applies a signal, corresponding to the movement direction and movement amount, to the lens system driving mechanism 34. On the basis of this signal, the lens system driving mechanism 34 moves the optical system 6 in a corresponding direction and by a corresponding amount (step 204). After this driving, angular distribution of illumination light is measured again (step 205). If deviation of on-axis telecentricity is within a tolerable range (206), the procedure goes to the next step. If not so, the operation described above is repeated, until the deviation comes into the tolerable range.

When the angular distribution of illumination light is measured, there may be a case where both the magnification telecentricity and on-axis telecentricity are deviated. In such cases, deviation in incidence angle of illumination light may be decomposed into a magnification telecentricity component and an on-axis telecentricity component. Then, correction may be made to these deviations, on the basis of combined procedures described with reference to FIGS. 7 and 9. Decomposition of a measured value on telecentricity deviation into a magnification telecentricity deviation component and an on-axis telecentricity deviation component, may be made easily by calculation based on a least square method, for example, using functions representing the magnification component and the shift component, for example.

After the angular distribution of illumination light is made proper (in a tolerable range), the detector 24 is used to measure the illuminance non-uniformness so as to check whether a standard level is satisfied or not. This is because, due to movement of the lens system 6, the illuminance distribution on the light entrance surface of the optical integrator 7 might have changed, causing degradation of illuminance distribution on the surface to be illuminated (i.e., reticle 14 surface or wafer 18 surface). If the illuminance non-uniformness satisfies the standard, the procedure is finished. If the illuminance non-uniformness does not satisfy the standard, the control device 30 performs calculation on the basis of the measured value, and then the illuminance non-uniformness correcting means corrects the non-uniformness. Thereafter, illuminance non-uniformness measurement is made again. If it satisfies the standard value, the procedure is finished. If not, the procedure for correcting illuminance non-uniformness is repeated, until the standard is satisfied.

As regards the illuminance non-uniformness correcting means, it may be based on a method in which an optical element of a wedged shape with a coating film having different transmission factors with different incidence angles of incident light or an inclined parallel flat plate as disclosed in Japanese Laid-Open Patent Application, Laid-Open No. 190969/1997 is incorporated into the stop mechanism 8, integrally with its stop member. On that occasion, in response to a change of illumination mode, also the illuminance non-uniformness correcting effect can be changed. Thus, by setting the illuminance non-uniformness correcting optical element mounted on the stop, in optimum, the illuminance non-uniformness can be optimized.

Figure 11A:
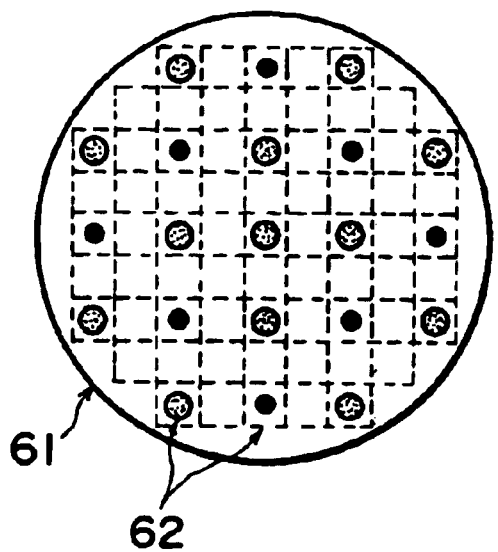
FIGS. 11A and 11B are schematic views, respectively, for explaining an example of illuminance non-uniformness correcting means with an optical filter.
Figure 11B:
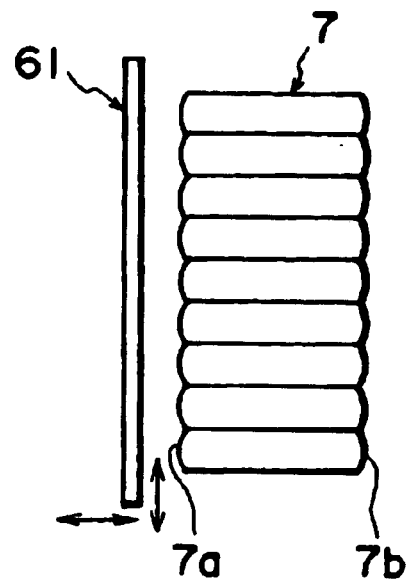

Another example of illuminance non-uniformness correcting means may be use of an optical filter 61 (FIG. 11) such as an ND filter disposed at the light entrance surface 7a of the optical integrator 7, as disclosed in Japanese Patent Application No. 126335/1997, wherein correction is made by moving the optical filter 61. By moving this optical filter 61 to an optimum position when the illumination mode is changed, the illuminance non-uniformness can be minimized.

Figure 12:
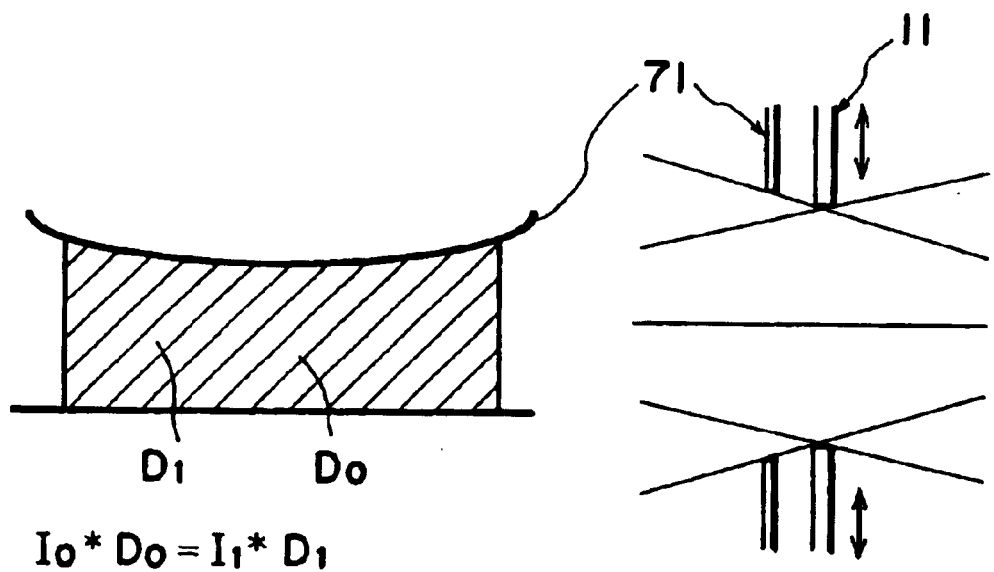
FIG. 12 is a schematic view for explaining an example of illuminance non-uniformness correcting means for use in a scanning exposure apparatus.

The examples of illuminance non-uniformness correcting means described above are for use in a step-and-repeat type projection exposure apparatus. For a step-and-scan type scanning projection exposure apparatus, on the other hand, slit means having a variable slit width with respect to a scan direction may be provided adjacent the masking blade 11 which is to be scanningly moved in synchronism with the reticle stage 15 and the X-Y stage 20. Illuminance non-uniformness can be corrected by it. FIG. 12 is a schematic view for explaining correction of illuminance non-uniformness in accordance with this method. If $I_0$ and $I_1$ denote the integrated exposure amounts, by scan, at certain slit positions and $D_0$ and $D_1$ denote the widths of the variable slit 71 corresponding to the slit positions, the following relation should be satisfied:

$$I_0 \times D_0 = I_1 \times D_1.$$

When this is accomplished, then the integrated exposure amount on the surface being illuminated as provided by the scan, that is, the illuminance distribution, can be made uniform.

Figure 10:
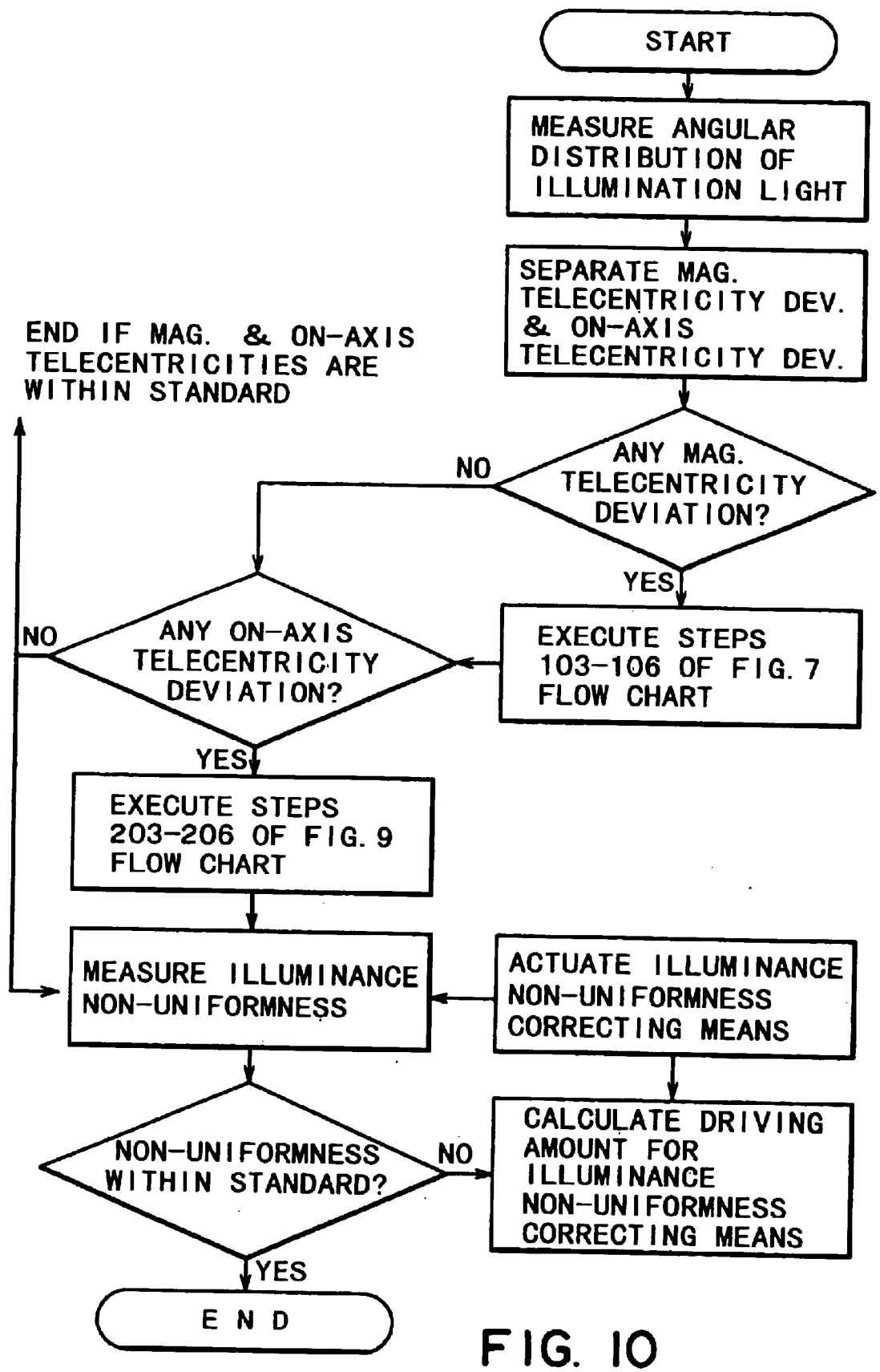
FIG. 10 is a flow chart for explaining the procedure wherein corrections for magnification telecentricity, on-axis telecentricity and illuminance non-uniformness are performed in series.

FIG. 10 is a flow chart for explaining the procedure for correcting magnification telecentricity and on-axis telecentricity in series as well as the procedure of correcting illuminance non-uniformness caused by the correction.

While the embodiments described above use a Hg lamp as the light source for producing an effective light source, the effective light source may be produced by using a laser, for example, without any functional modification to the described embodiments.

Next, an embodiment of a semiconductor device manufacturing method which uses a projection exposure apparatus according to any one of the preceding embodiments, will be explained.

Figure 13:
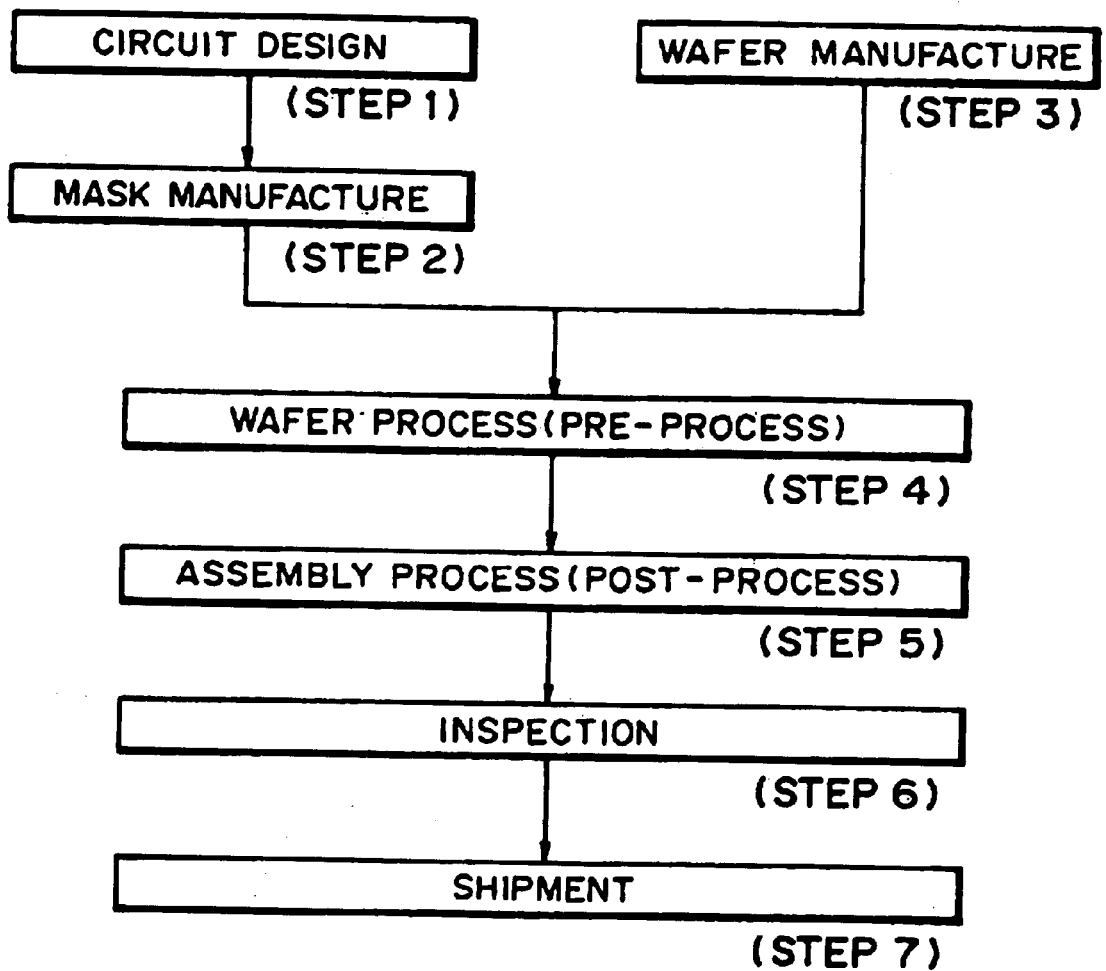
FIG. 13 is a flow chart of device manufacturing processes, in an embodiment of the present invention.

FIG. 13 is a flow chart of a procedure for the manufacture of microdevices such as semiconductor chips (e.g., ICs or LSIs), liquid crystal panels, or CCDS, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
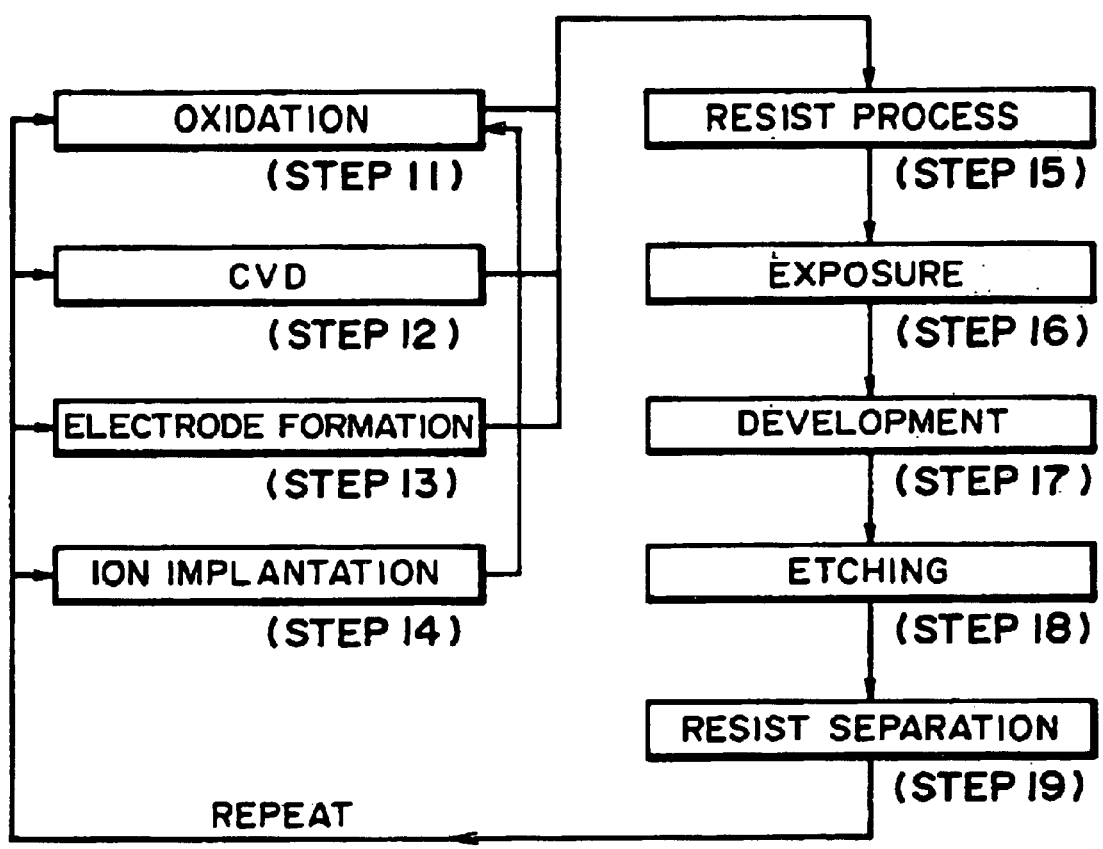
FIG. 14 is a flow chart of a wafer process in the procedure of FIG. 13.

FIG. 14 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention described hereinbefore, the components are specified as described above, by which deviation of magnification telecentricity and deviation of on-axis telecentricity to be produced when the illumination mode or illumination condition is changed, can be corrected independently of each other. As a result, the illumination light can be supplied with optimum angle. Thus, a projection exposure apparatus and a device manufacturing method using the same, with which a pattern image of very high resolution is attainable, can be accomplished.

An example of correcting means may use the function for measuring the angular distribution of illumination light, and feedback control may be performed on the basis of the result of measurement.

Any non-uniformness of illuminance to be produced as a result of correction of telecentricity deviation can be corrected by using a mechanism for correcting it independently of the telecentricity correcting function. This accomplishes a projection exposure apparatus and a device manufacturing method using the same, with which the illuminance uniformness on the surface to be illuminated can be maintained and various reticle patterns can be projected on a wafer surface stably with high resolution.

Angular distribution of exposure light entering a projection optical system or of a deviation of incidence angle of exposure light may be measured and, on the basis of the result of measurement, an optical element in a portion of an illumination system may be moved or inserted/demounted. This enables independent correction of deviations of magnification telecentricity and on-axis telecentricity regardless of various changes of illumination mode or illumination condition, and also it enables correction of illuminance distribution to be produced by the correction. Therefore, a projection exposure apparatus or a device manufacturing method using the same, with which various reticle patterns can be projected on a wafer stably with high resolution, can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an illumination optical system for illuminating a reticle with light from a light source, wherein said illumination optical system includes an optical integrator for producing a secondary light source with the light from the light source, and masking means for restricting an illumination range upon the reticle, which is to be illuminated, with illumination light from the secondary light source;
   a projection optical system for projecting a pattern of the reticle, as illuminated, onto a substrate;
   measuring means for measuring telecentricity of said projection optical system; and
   changing means for changing an incidence angle of the illumination light, to adjust the telecentricity on the basis of the result of the measurement, wherein said changing means moves an optical element disposed in a portion of said illumination optical system between said optical integrator and said masking means, along an optical axis direction.

2. An apparatus according to claim 1, wherein said optical element is a lens.

3. A projection exposure apparatus, comprising:
   an illumination optical system for illuminating a reticle with illumination light;
   a projection optical system for projecting a pattern of the reticle, as illuminated, onto a substrate;
   measuring means for measuring telecentricity of said projection optical system with respect to different image heights, including an on-axis position and an off-axis position;
   first changing means for changing an incidence angle of the illumination light, to adjust the telecentricity with respect to the on-axis position, on the basis of the result of the measurement with respect to the on-axis position; and
   second changing means for changing an incidence angle of the illumination light to adjust the telecentricity with respect to the off-axis position, on the basis of the result of the measurement with respect to the off-axis position.

4. An apparatus according to claim 3, wherein said illumination optical system includes an optical integrator for producing a secondary light source with illumination light supplied from the light source, and wherein said first changing means includes an optical element, which is disposed at a light entrance side of said optical integrator.

5. An apparatus according to claim 4, wherein said illumination optical system includes an optical integrator for producing a secondary light source with light supplied from the light source and wherein said second changing means includes an optical element disposed at a light exit side of said optical integrator.

6. An apparatus according to claim 3, wherein said illumination optical system includes an optical integrator for producing a secondary light source with light supplied from the light source and wherein said second changing means includes an optical element disposed at a light exit side of said optical integrator.

7. A projection exposure apparatus, comprising:
   an illumination optical system for illuminating a reticle with illumination light;
   a projection optical system for projecting a pattern of the reticle, as illuminated, onto a substrate;
   measuring means for measuring telecentricity of said projection optical system;
   changing means for changing an incidence angle of the illumination light, to adjust the telecentricity on the basis of the result of the measurement; and
   adjusting means for adjusting an illuminance distribution on a substrate, in accordance with a change made by said changing means.

8. A device manufacturing method, comprising the steps of:
   exposing a wafer with a device pattern in an exposure apparatus in which a reticle is illuminated by an illumination optical system wherein a secondary light source is produced with light from a light source by an optical integrator and an illumination range upon the reticle which is to be illuminated with illumination light from the secondary light source is restricted by masking means, a pattern of the reticle as illuminated is projected onto the wafer by a projection optical system, telecentricity of the projection optical system is measured by measuring means and an incidence angle of the illumination light is changed by changing means to adjust the telecentricity of the basis of the result of the measurement with the changing means moving an optical element disposed in a portion of said illumination optical system between the optical integrator and the masking means, along an optical axis direction; and
   developing the exposed wafer.

9. A device manufacturing method, comprising the steps of:
   exposing a wafer with a device pattern in an exposure apparatus in which a reticle is illuminated with illumination light by an illumination optical system, a pattern of the reticle is projected by a projection optical system, telecentricity of the projection optical system is measured with respect to different image heights including an on-axis position and an off-axis position by measuring means, an incidence angle of the illumination light is changed to adjust the telecentricity with respect to the on-axis position on the basis of the result of the measurement with respect to the on-axis position by first changing means and an incident angle of the illumination light is changed to adjust the telecentricity with respect to the off-axis position on the basis of the result of the measurement with respect to the off-axis position by second changing means; and
   developing the exposed wafer.

10. A device manufacturing method, comprising the steps of:
    exposing a wafer with a device pattern in an exposure apparatus in which a reticle is illuminated with illumination light by an illumination optical system, a pattern of the reticle as illuminated is projected onto the wafer by a projection optical system, telecentricity of the projection optical system is measured by measuring means, an incidence angle of the llumination light is changed to adjust the telecentricity by changing means on the basis of the result of the measurement and iluminance distribution on the wafer is adjusted by adjusting means in accordance with a change made by the changing means; and
    developing the exposed wafer.

11. A scan type projection exposure apparatus, comprising:
  an illumination optical system for illumination a reticle with illumination light, said illumination optical system having a variable illumination mode; and
  a projection optical system for projecting a pattern of the reticle illuminated by said illumination optical system, onto a substrate;
  wherein said illumination optical system includes a movable lens which can be driven for adjustment of telecentricity of said projection optical system, and masking means for regulating an illumination range by the illumination light, said masking means having a slit-like opening which has a width being variable for making uniform an integrated exposure amount during scan exposure, and wherein, in accordance with the change of illumination mode, said movable lens is driven and the width of the opening is adjusted.

12. An apparatus according to claim 11, further comprising measuring means for measuring the telecentricity of said projection optical system, said measuring means being provided on a stage for holding the substrate.

13. An apparatus according to claim 12, wherein said measuring means measures axial telecentricity and abaxial telecentricity.

14. An apparatus according to claim 11, wherein said illumination optical system includes a first optical system for collecting light from a light source onto an optical integrator, and a second optical system for collecting light from said integrator onto the reticla, wherein said second optical system is provided with said movable lens and said masking means.

15. An apparatus according to claim 14, wherein said first optical system also is provided with said movable lens.

16. An apparatus according to claim 14, wherein said second optical system includes a condenser lens for collecting light from said integrator onto said masking means, and an imaging lens for imaging the opening of said masking means upon the reticle, and wherein said condenser lens is provided with said movable lens.

17. A projection exposure apparatus, comprising:
  an illumination optical system for illumination a reticle with illumination light, said illumination optical system having a variable illumination mode; and
  a projection optical system for projecting a pattern of the reticle illuminated by said illumination optical system, onto a substrate;
  wherein said illumination optical system includes a first optical element for changing the illumination mode, a second optical element for adjusting telecentricity of said projection optical system, and a third optical element for adjusting non-uniformness of illuminance upon an image plane of said projection optical system.

18. An apparatus according to claim 17, further comprising measuring means for measuring the telecentricity of said projection optical system, said measuring means being provided on a stage for holding the substrate.

19. An apparatus according to claim 18, wherein said measuring means measures axial telecentricity and abaxial telecentricity.

20. A projection exposure apparatus, comprising:
  an illumination optical system for illumination a reticle with illumination light, said illumination optical system having a variable illumination mode; and
  a projection optical system for projecting a pattern of the reticle illuminated by said illumination optical system, onto a substrate;
  wherein said illumination optical system includes an optical member for changing the illumination mode, a first optical element for adjusting axial telecentricity of said projection optical system, and a second optical element for adjusting abaxial telecentricity of said projection optical system, wherein said first optical element is disposed at light entrance side of an optical integrator while said second optical element is disposed at light exit side of said integrator.

21. An apparatus according to claim 20, further comprising measuring means for measuring the telecentricity of said projection optical system, said measuring means being provided on a stage for holding the substrate.

22. An apparatus according to claim 21, wherein said measuring means measures axial telecentricity and abaxial telecentricity.

23. A device manufacturing method, comprising the steps of:
  exposing a wafer with a device pattern in a scan type projection exposure apparatus in which a reticle is illuminated with illumination light in an illumination optical system having a variable illumination mode wherein a movable lens is driven for adjustment of telecentricity of the projection optical system, an illumination range of the illumination light is regulated by masking means and an integrated exposure amount during scan exposure is made uniform by a slit-like opening in the masking means and the movable lens is driven and the width of the opening is adjusted in accordance with the change of illumination mode; and
  developing the exposed wafer.

24. A device manufacturing method according to claim 23, in which the telecentricity of the projection optical system is measured by measuring means provide on a stage for holding the substrate.

25. A device manufacturing method according to claim 24, wherein axial telecentricity and abaxial telecentricity are measured by the measuring means.

26. A device manufacturing method according to claim 23, wherein light from a light source is collected onto an optical integrator in a first optical system in said illumination optical system and light from the integrator is collected by a second optical system in said illumination system onto the reticle, the second optical system being provided with the movable lens and the masking means.

27. A device manufacturing method according to claim 26, wherein the first optical system is also provided with the movable lens.

28. A device manufacturing method according to claim 26, wherein a condenser lens in the second optical system collects light from the integrator onto the masking means, the opening of the masking means is imaged in an imaging lens and the condenser lens is provided with the movable lens.

29. A device manufacturing method, comprising the steps of:
  exposing a wafer with a device pattern in a scan type projection exposure apparatus in which a reticle is illuminated with illumination light by an illumination optical system having a variable illumination mode and a pattern of the reticle illuminated by the illumination optical system is projected by a projection optical system, wherein the illumination mode is changed by a first optical element in the illumination optical system, the telecentricity of the projection optical system is adjusted by a second optical element in the illumination optical system and non-uniformness of illuminance of upon an image plane of the projection optical system is adjusted by a third optical element in the illumination optical system; and developing the exposed wafer.

30. A device manufacturing method according to claim 29, wherein the telecentricity of the projection optical system is measured by measuring means provided on a stage for holding a substrate.

31. A device manufacturing method according to claim 30, wherein axial and abaxial telecentricity is measured by the measuring means.

32. A device manufacturing method, comprising the steps of:

exposing a wafer with a device pattern in a scan type projection exposure apparatus in which a reticle is illuminated by illumination light of an illumination optical system having a variable illumination mode and a pattern of the reticle illuminated by the illumination optical system is projected onto a substrate by a projection optical system, wherein the illumination mode is changed by an optical member in the illumination optical system, axial telecentricity is adjusted by a first optical element disposed at a light entrance side of an optical integrator in the illumination optical system and abaxial telecentricity of the projection optical system is adjusted by a second optical element disposed at a light exit side of the integrator in the illumination optical system; and developing the exposed wafer.

33. A device manufacturing method according to claim 32 in which the telecentricity of the projection optical system is measured by measuring means provided on a stage for holding the substrate.

34. A device manufacturing method according to claim 33, wherein axial telecentricity and abaxial telecentricity are measured by the measuring means.

* * * * *

UNITED STATES PATENT AND TRADEMARK OFFICE
CERTIFICATE OF CORRECTION

PATENT NO. : 6,768,546 B2
DATED : July 27, 2004
INVENTOR(S) : Hiroshi Sato

It is certified that error appears in the above-identified patent and that said Letters Patent is hereby corrected as shown below:

<u>Title page,</u>
Item [*] Notice, insert -- This patent issued on a continued prosecution application filed under 37 CFR 1.53(d), and is subject to the twenty year patent term provisions of 35 U.S.C. 154(a)(2). --

<u>Column 3,</u>
Line 37, "step and-scan" should read -- step-and-scan --.

<u>Column 4,</u>
Line 62, "wafer 1B," should read -- wafer 18, --.

<u>Column 5,</u>
Line 65, "on axis" should read -- on-axis --.

<u>Column 9,</u>
Line 38, "$l_0 x D_0 = I_1 x D_1$." should read -- $I_0 x D_0 = I_1 x D_1$. --.
Line 59, "CCDS," should read -- CCDs, --.
Line 65, "so prepared" should read -- so-prepared --.

<u>Column 12,</u>
Line 61, "llumination" should read -- illumination --.
Line 64, "iluminance" should read -- illuminance --.

<u>Column 13,</u>
Lines 3, 42 and 62, "illumination" (second occurrence) should read -- illuminating --.
Line 29, "reticla," should read -- reticle, --.

UNITED STATES PATENT AND TRADEMARK OFFICE
CERTIFICATE OF CORRECTION

PATENT NO. : 6,768,546 B2
DATED : July 27, 2004
INVENTOR(S) : Hiroshi Sato

It is certified that error appears in the above-identified patent and that said Letters Patent is hereby corrected as shown below:

<u>Column 14,</u>
Line 33, "provide," should read -- provided --.
Line 67, "illuminance of" should read -- illuminance --.

Signed and Sealed this

Tenth Day of May, 2005

JON W. DUDAS
*Director of the United States Patent and Trademark Office*